(12) United States Patent
Zhan et al.

(10) Patent No.: US 12,035,060 B2
(45) Date of Patent: Jul. 9, 2024

(54) STACKED IMAGE SENSOR

(71) Applicant: OmniVision Technologies, Inc., Santa Clara, CA (US)

(72) Inventors: Zhiyong Zhan, Fremont, CA (US); Yin Qian, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 194 days.

(21) Appl. No.: 17/520,466

(22) Filed: Nov. 5, 2021

(65) Prior Publication Data
US 2023/0144963 A1    May 11, 2023

(51) Int. Cl.
*H04N 25/70* (2023.01)
*G03B 17/55* (2021.01)
*H01L 27/146* (2006.01)
*H04N 23/52* (2023.01)
*H04N 23/54* (2023.01)
*H04N 23/57* (2023.01)
*H04N 25/709* (2023.01)
*H04N 25/79* (2023.01)
*H05K 1/02* (2006.01)
*H05K 7/20* (2006.01)

(52) U.S. Cl.
CPC ............. *H04N 25/70* (2023.01); *G03B 17/55* (2013.01); *H01L 27/14601* (2013.01); *H01L 27/14618* (2013.01); *H01L 27/14621* (2013.01); *H01L 27/14627* (2013.01); *H01L 27/14634* (2013.01); *H01L 27/14636* (2013.01); *H01L 27/1464* (2013.01); *H01L 27/1469* (2013.01); *H04N 23/52* (2023.01); *H04N 23/54* (2023.01); *H04N 23/57* (2023.01); *H04N 25/709* (2023.01); *H04N 25/79* (2023.01); *H05K 1/0203* (2013.01); *H05K 1/0206* (2013.01); *H05K 7/2039* (2013.01); *H05K 2201/10121* (2013.01)

(58) Field of Classification Search
CPC ........ H04N 25/70; H04N 25/79; H04N 23/52; H04N 23/54; H04N 23/57; H01L 27/146; H01L 27/1464; H01L 27/14634; H01L 27/14636; H05K 1/0201–0212; H05K 7/2039–20518
See application file for complete search history.

(56) References Cited

U.S. PATENT DOCUMENTS 5,506,755 A  *  4/1996  Miyagi ............... H01L 23/3677
                                                 361/720
6,472,741 B1   10/2002  Chen et al.
(Continued)

*Primary Examiner* — Twyler L Haskins
*Assistant Examiner* — Akshay Trehan
(74) *Attorney, Agent, or Firm* — COZEN O'CONNOR

(57) ABSTRACT

A stacked image sensor includes a signal-processing circuitry layer, a pixel-array substrate, a heat-transport layer, and a thermal via. The signal-processing circuitry layer includes a conductive pad exposed on a circuitry-layer bottom surface of the signal-processing circuitry layer. The pixel-array substrate includes a pixel array and is disposed on a circuitry-layer top surface of the signal-processing circuitry layer. The circuitry-layer top surface is between the circuitry-layer bottom surface and the pixel-array substrate. The heat-transport layer is located between the signal-processing circuitry layer and the pixel-array substrate. The thermal via thermally couples the heat-transport layer to the conductive pad.

22 Claims, 10 Drawing Sheets

(56) References Cited

U.S. PATENT DOCUMENTS

| | | |
|---|---|---|
| 8,274,101 B2 | 9/2012 | Venezia et al. |
| 10,510,912 B2 | 12/2019 | Huang et al. |
| 10,714,525 B2 | 7/2020 | Yee et al. |
| 2006/0006517 A1 | 1/2006 | Lee et al. |
| 2008/0169556 A1 | 7/2008 | Liu |
| 2008/0173792 A1* | 7/2008 | Yang ................ H01L 27/14636 250/208.1 |
| 2010/0295178 A1* | 11/2010 | Ishihara ................ H05K 1/187 257/737 |
| 2011/0089517 A1* | 4/2011 | Venezia ............ H01L 27/14603 257/443 |
| 2013/0010145 A1* | 1/2013 | Hagiwara ......... H01L 27/14634 348/222.1 |
| 2015/0181698 A1* | 6/2015 | Suganuma ........ H01L 27/14636 174/254 |
| 2017/0104019 A1* | 4/2017 | Jung ................... H01L 27/1462 |
| 2018/0084647 A1* | 3/2018 | Nalla ................... H05K 3/4697 |
| 2018/0211989 A1* | 7/2018 | Hogyoku ............... H01L 24/18 |
| 2019/0140112 A1* | 5/2019 | Huang .............. H01L 27/14634 |
| 2019/0244997 A1* | 8/2019 | Yee ..................... H01L 27/1464 |
| 2021/0195076 A1* | 6/2021 | Chen ...................... H04N 23/56 |
| 2022/0045111 A1* | 2/2022 | Jo .................... H01L 27/14609 |
| 2022/0165778 A1* | 5/2022 | Kim ................. H01L 27/14634 |
| 2022/0262841 A1* | 8/2022 | Shigeta ............ H01L 27/14618 |

* cited by examiner

STACKED IMAGE SENSOR

BACKGROUND

The present invention relates to image sensors, stacked image sensors, and specifically, remedying image artifacts caused by heat generated beneath the image sensor.

Camera modules in consumer devices such as stand-alone digital cameras, mobile devices, automotive components, and medical devices include an image sensor and a pixel array thereof image sensors include a pixel array that converts light imaged thereon by a camera lens into a digital signal that is converted into a displayed image and/or file containing the image data. Some image sensors, known as stacked-chip image sensors, include logic chip beneath the image sensor, herein also referred to an image sensor chip. The logic chip includes analog to digital conversion circuitry and image signal processing (ISP) circuitry. Examples of the logic chip include an ASIC and an image signal processor. Possible functions of the ISP include image processing, video processing and streaming, and high-speed data transfer.

When operating, the logic chip generates heat that propagates to one or more regions of the image sensor chip, which increases dark current in pixels in those regions, and results in image artifacts known as dark image non-uniformity. One method for reducing dark image non-uniformity is to power off pixel circuitries when not in use, but this approach places limits on sensor timing, which renders the image sensor incompatible for certain imaging scenarios such as automotive applications when idle time is relatively sparse. A different method for reducing dark image non-uniformity is to increase the spatial uniformity of high-power, and hence heat-producing, elements of the logic chip across the chip. A disadvantage of this method is that elements positioned further from the voltage source received a lower voltage due to electrical resistance between the voltage source and the element.

SUMMARY OF THE EMBODIMENTS

In a first aspect, a stacked image sensor includes a signal-processing circuitry layer, a pixel-array substrate, a heat-transport layer, and a thermal via. The signal-processing circuitry layer includes a conductive pad exposed on a circuitry-layer bottom surface of the signal-processing circuitry layer. The pixel-array substrate includes a pixel array and is disposed on a circuitry-layer top surface of the signal-processing circuitry layer. The circuitry-layer top surface is between the circuitry-layer bottom surface and the pixel-array substrate. The heat-transport layer is located between the signal-processing circuitry layer and the pixel-array substrate. The thermal via thermally couples the heat-transport layer to the conductive pad.

In a second aspect, a stacked image sensor includes a heat-sink layer, a signal-processing circuitry layer disposed on the heat-sink layer, a pixel-array substrate, a heat-transport layer, and a thermal via. The pixel-array substrate includes a pixel array and being disposed on the signal-processing circuitry layer. The heat-transport layer is located between the signal-processing circuitry layer and the pixel-array substrate. The thermal via thermally couples the heat-transport layer to the heat-sink layer.

Figure 4:
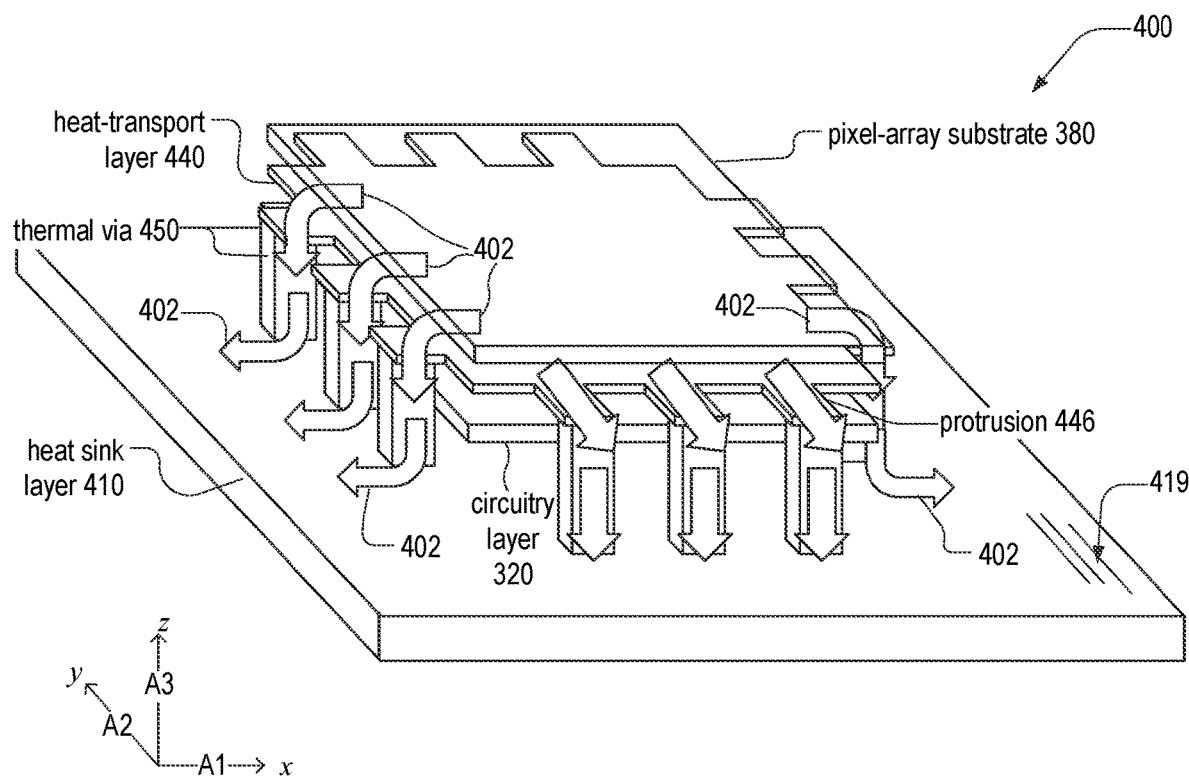
FIG. 4 is an isometric view of an image sensor that includes a heat transport layer, which is an example of the image sensor of FIG. 1.
Figure 6:
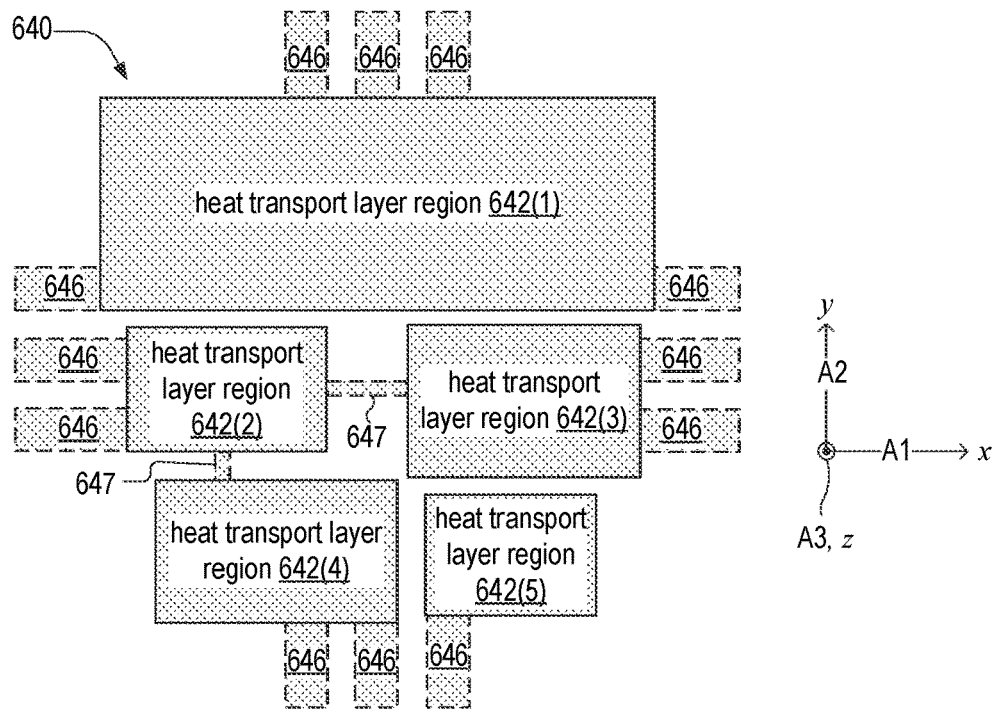
Figure 7:
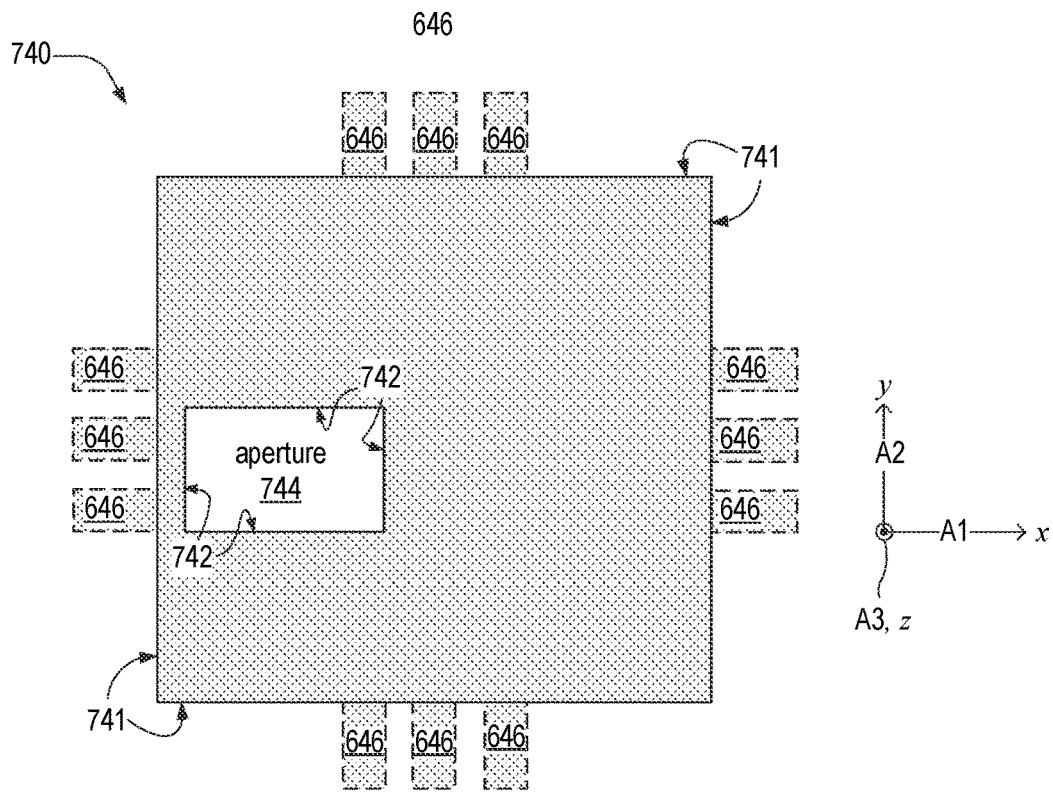

Each of FIGS. 6 and 7 is a respective schematic plan view of a heat-transport layer that is an example of a heat-transport layer of FIG. 4.

Figure 8:
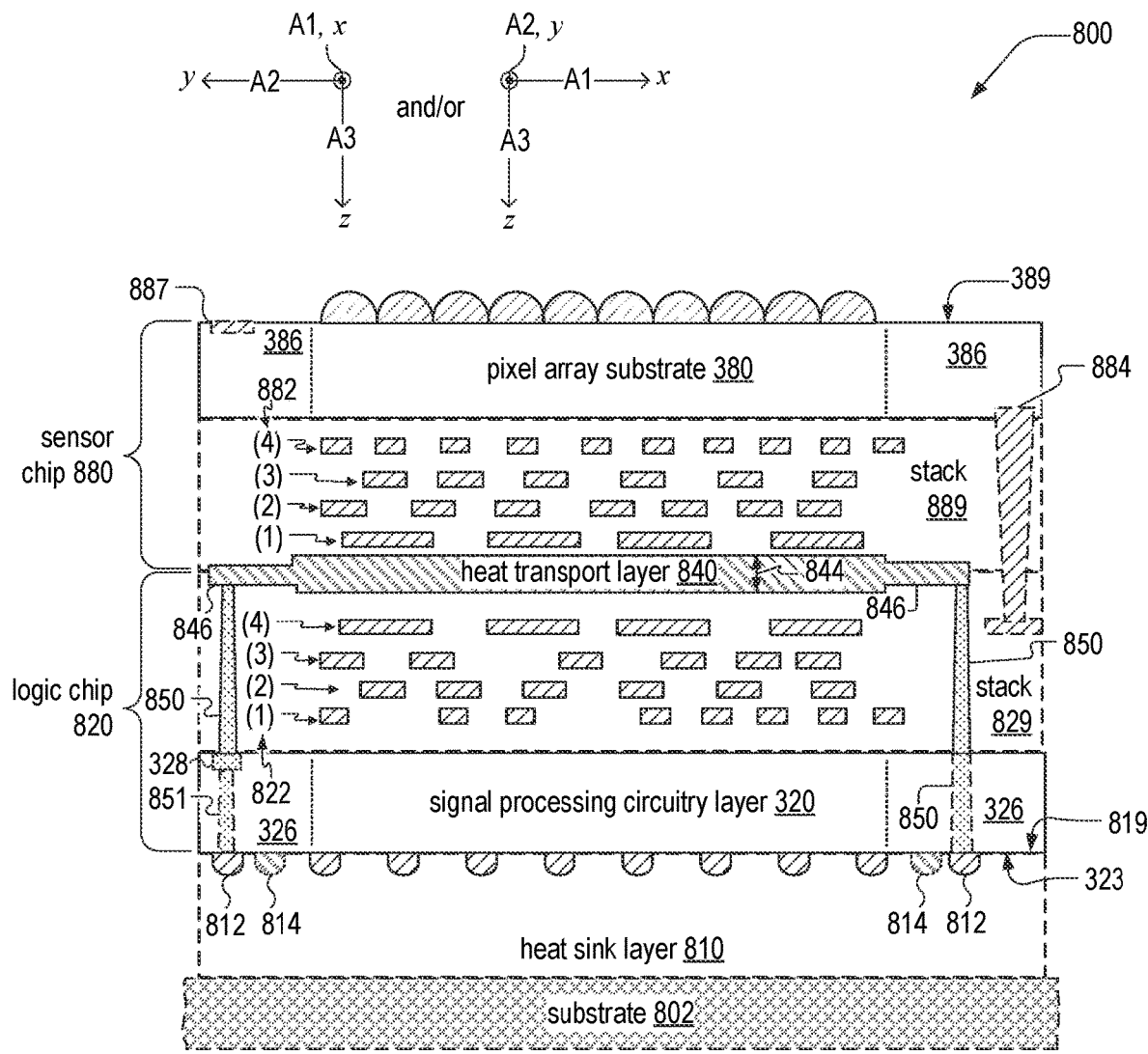

FIG. 8 is a cross-sectional view of an image sensor, which is an example of the image sensor of FIG. 4.

Figure 9:
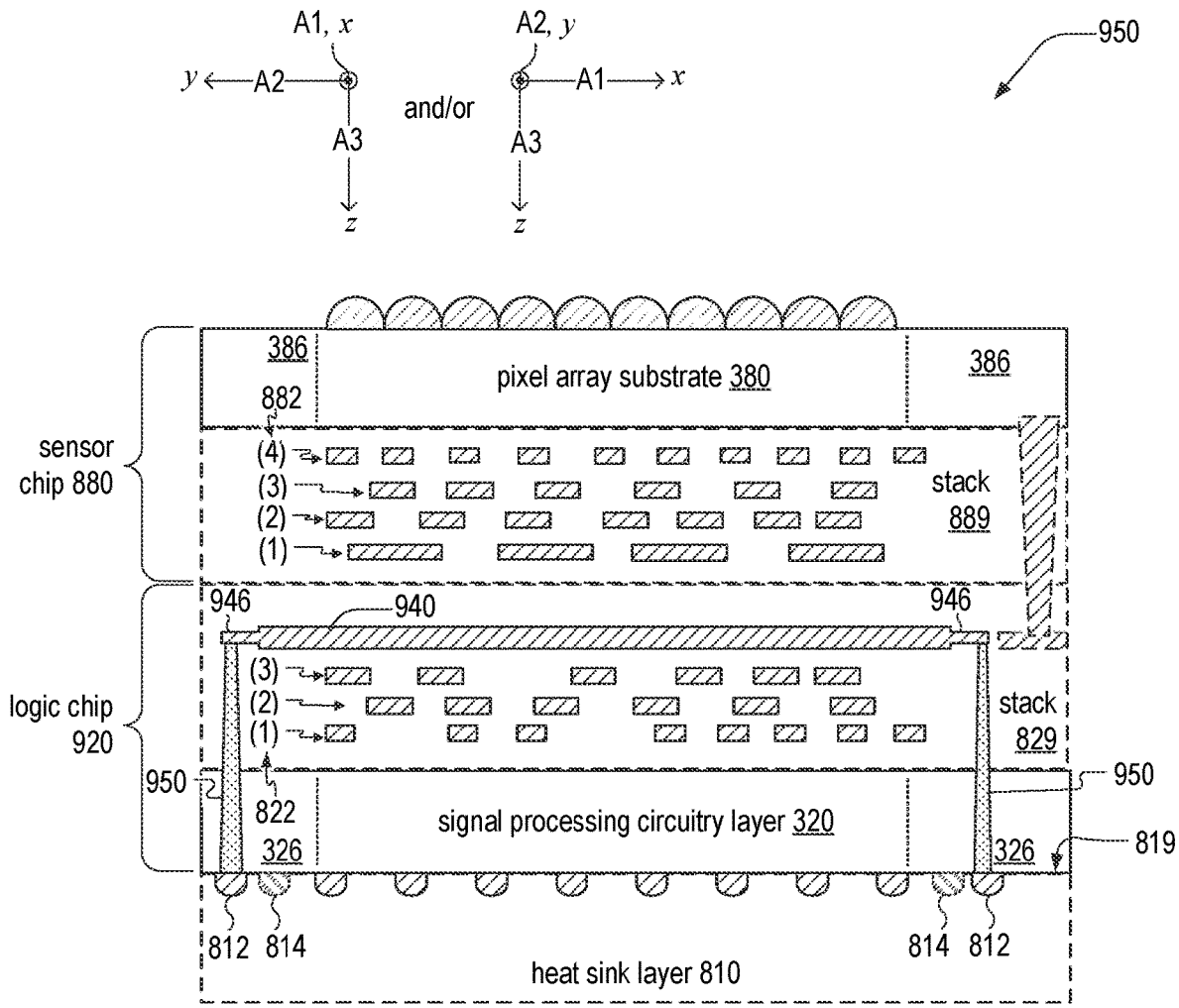
Figure 10:
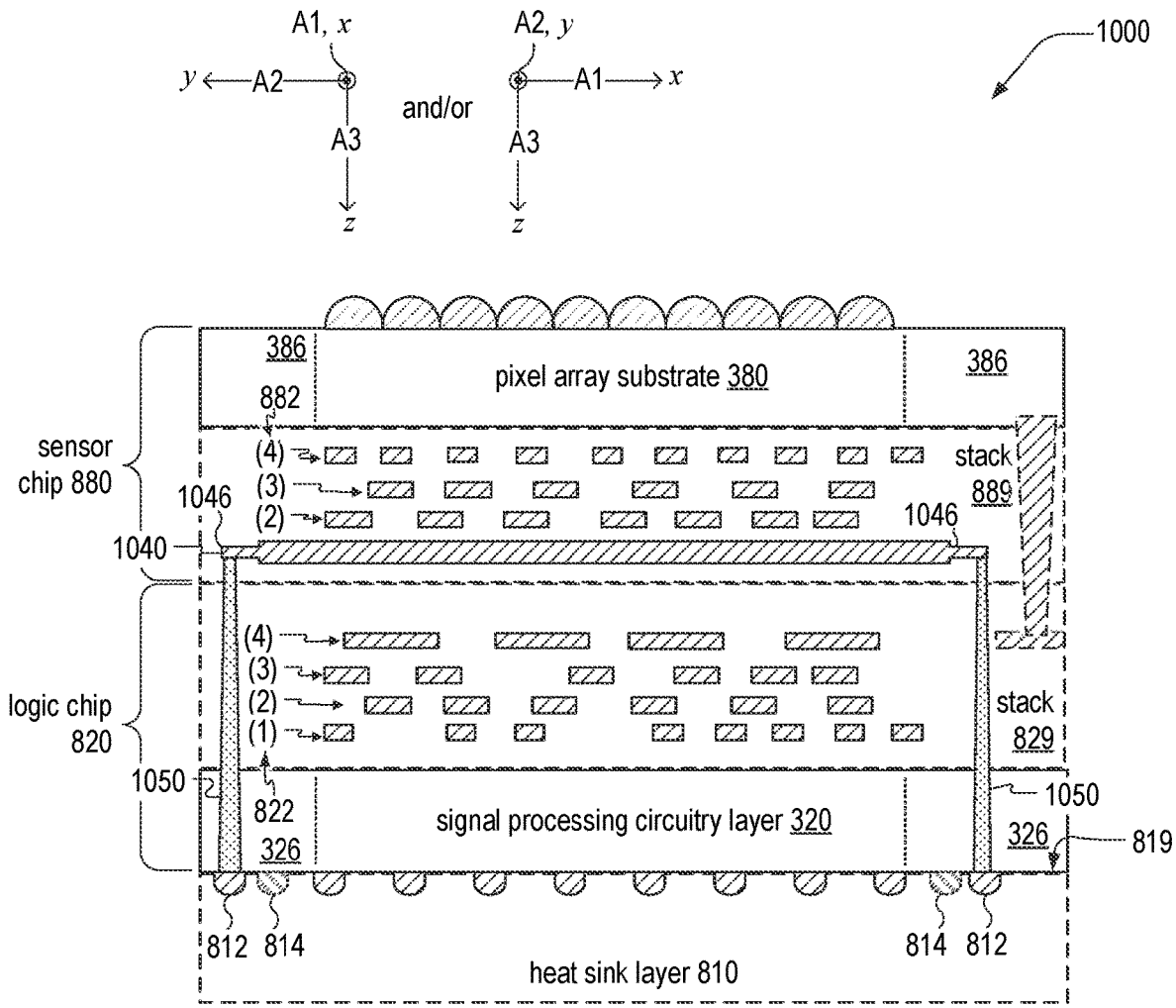

FIGS. 9 and 10 are cross-sectional views of respective image sensors, that are examples of the image sensor of FIG. 8.

Figure 11:
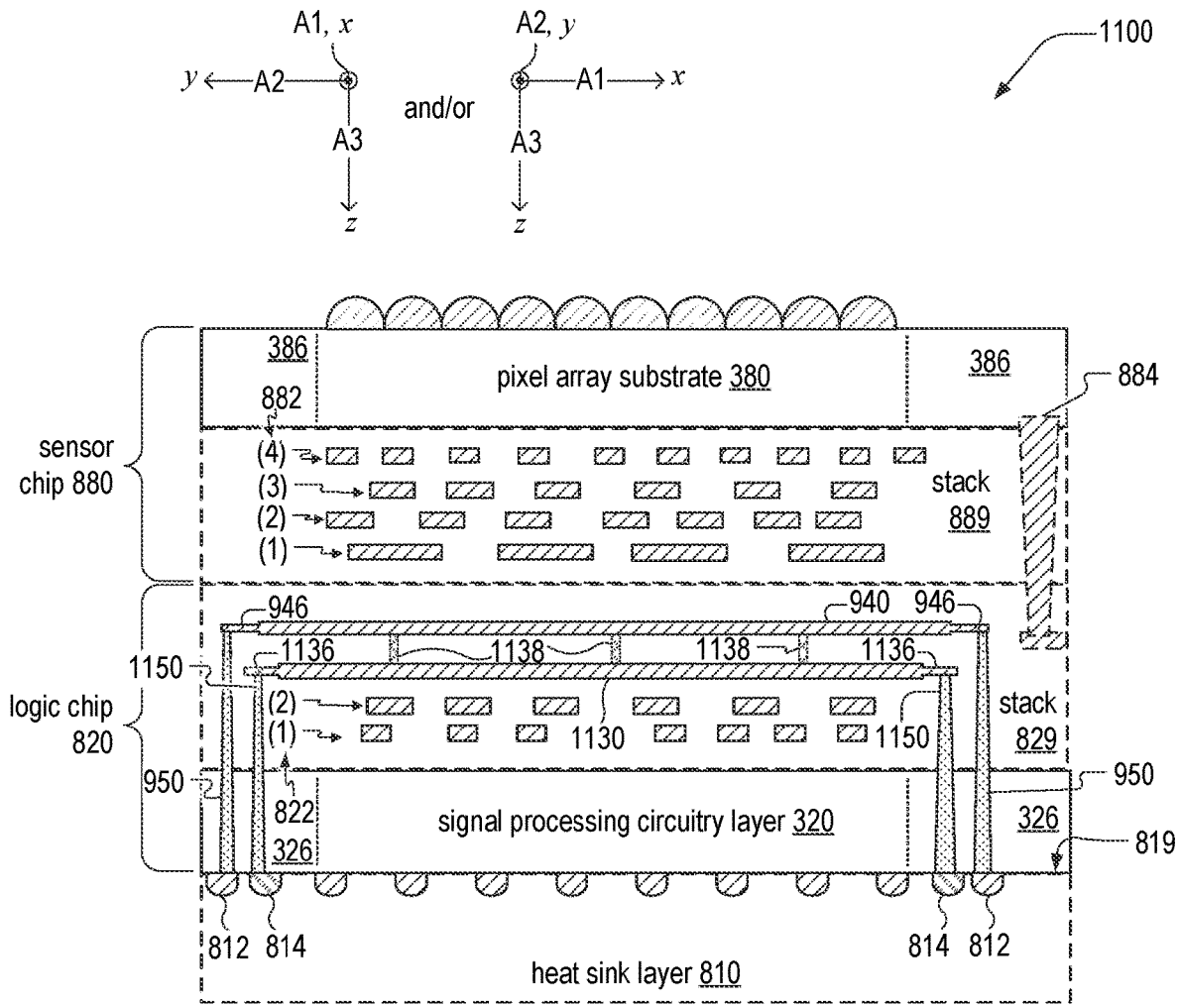

FIG. 11 is a cross-sectional view of an image sensor, which is an example of the image sensor of FIG. 9.

Figure 12:
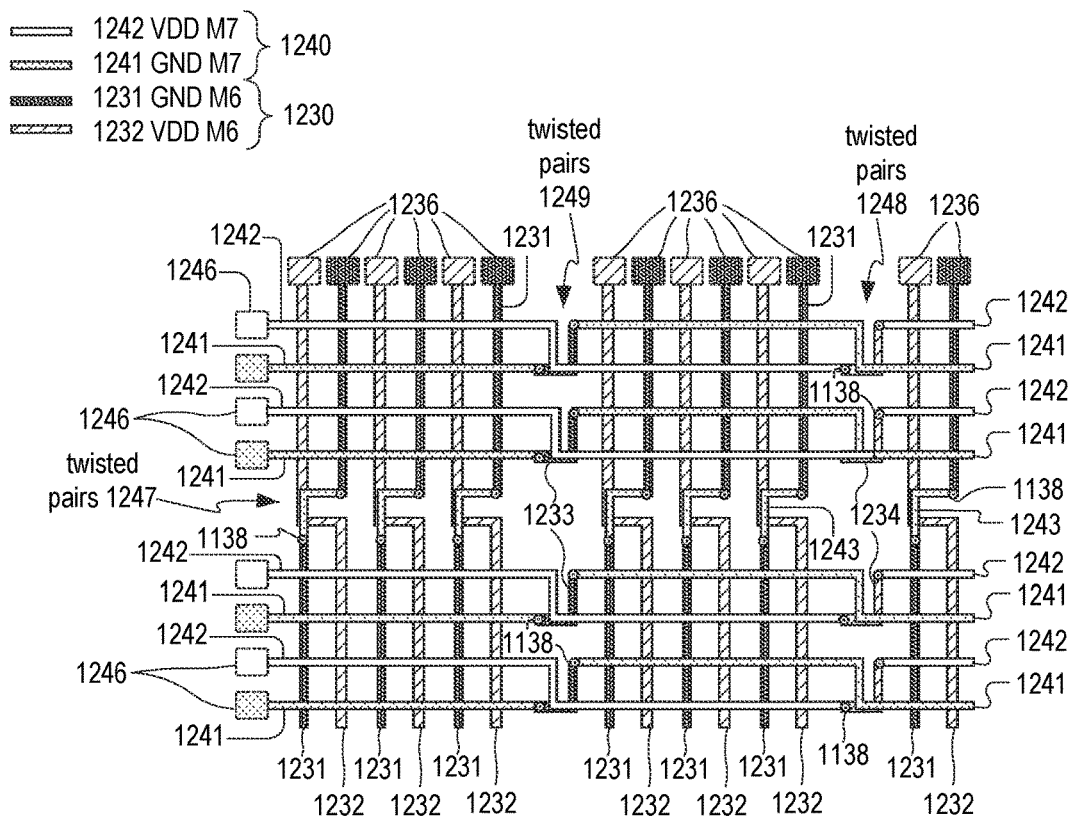

FIG. 12 is a schematic plan view of two adjacent heat-transport layers, which are respective examples of adjacent heat-transport layers of the image sensor of FIG. 11.

Figure 13:
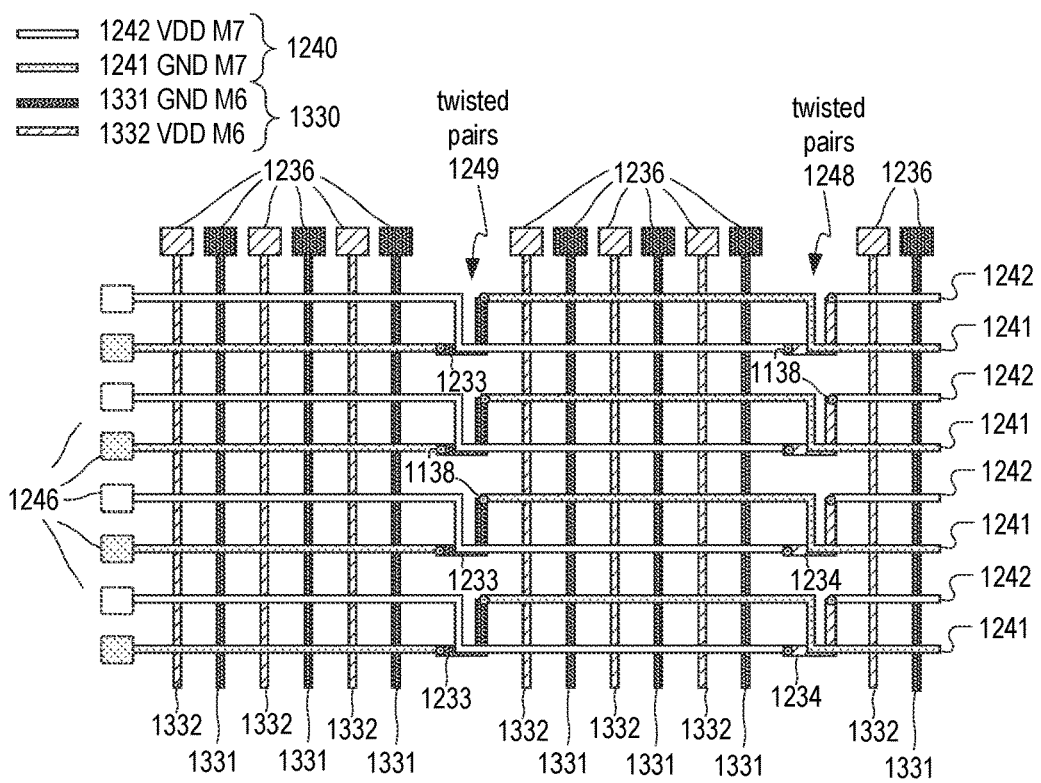

FIG. 13 is a schematic plan view of two adjacent heat-transport layers, which are also respective examples of adjacent heat-transport layers of the image sensor of FIG. 11.

Figure 14:
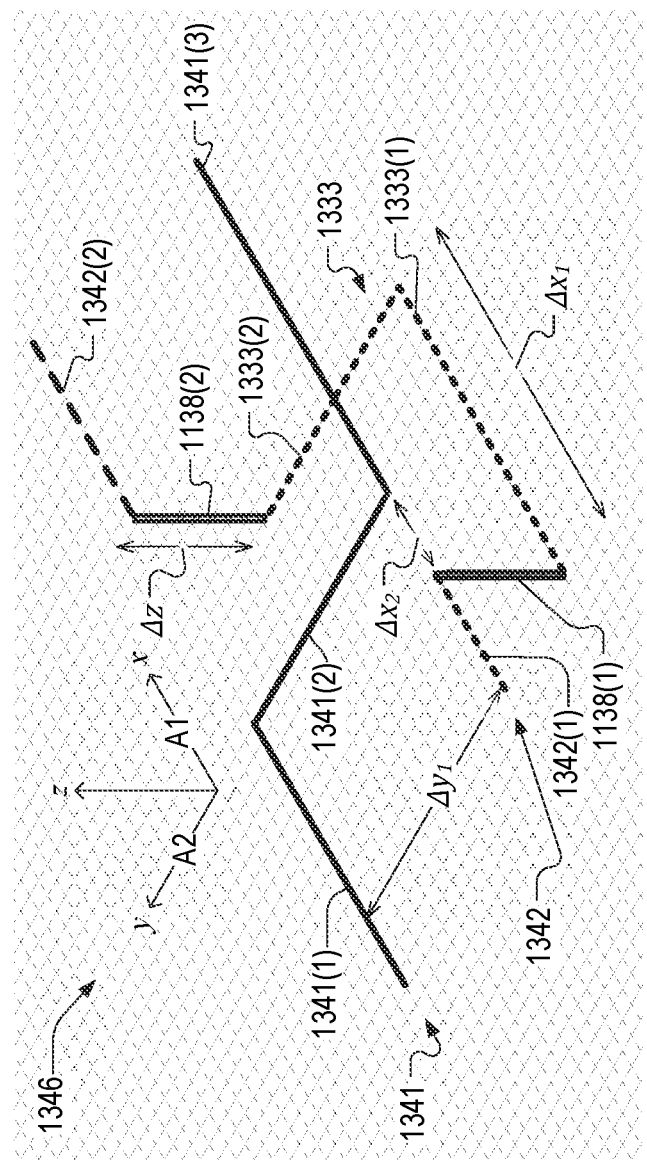

FIG. 14 is an isometric view of a twisted pair, which is example twisted pairs FIGS. 12 and 13.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed of one or more semiconductors such as silicon, silicon-germanium, germanium, gallium arsenide, indium gallium arsenide, and other semiconductor materials known to those of skill in the art. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate. It should be noted that element names and symbols may be used interchangeably through this document (e.g., Si vs. silicon); both have identical meanings.

Figure 1:
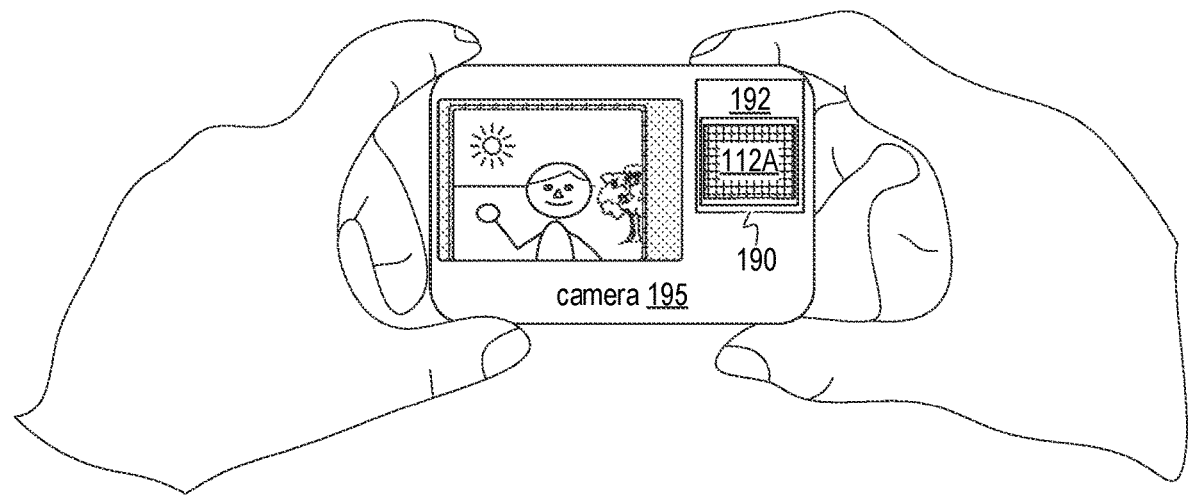
FIG. 1 depicts a camera imaging a scene; the camera includes an image sensor.

FIG. 1 depicts a camera 195 imaging a scene. Camera 195 includes an image sensor 192, which includes a pixel-array substrate 190. Constituent elements of pixel-array substrate 190 may include at least one of silicon and germanium. Pixel-array substrate 190 includes a pixel array 112A. Image sensor 192 may part of a chip-scale package or a chip-on-board package. Camera 195 is shown as a component of a handheld device, but it should be appreciated that other devices, such as security devices, automobile cameras, drone cameras, etc. may utilize camera 195 without departing from the scope hereof.

Figure 2:
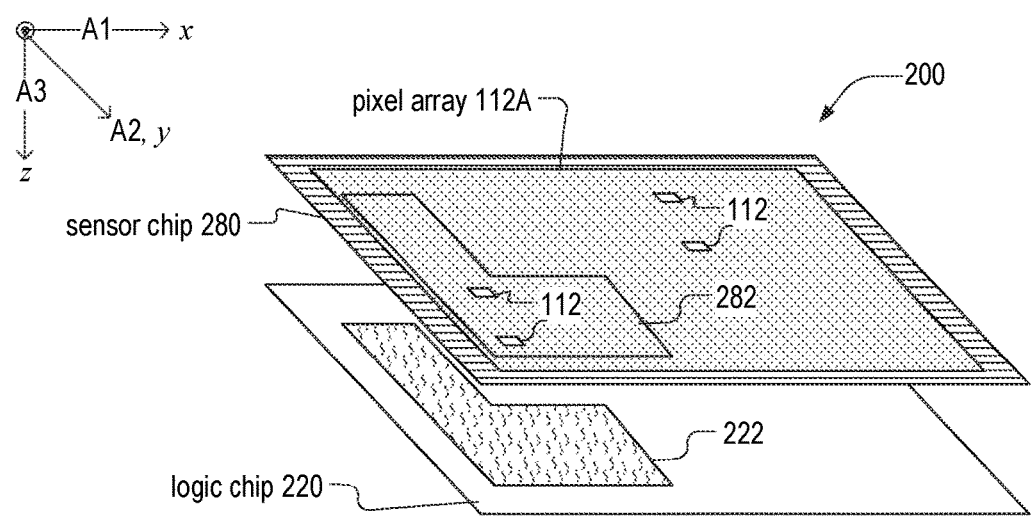
FIG. 2 is a schematic of a stacked-chip image sensor, which is an example of the image sensor of FIG. 1.

FIG. 2 is a schematic of a stacked-chip image sensor 200, which includes a logic chip 220 and a sensor chip 280 aligned above logic chip 220. Stacked-chip image sensor 200 is an example of image sensor 192. Sensor chip 280 includes pixel array 112A formed of an array of pixels 112. In operation, logic chip develops a high-temperature region 222, which transmits heat to a heated region 282 of sensor chip 280. Pixels 112 located in heated region 282 exhibit higher dark current than do pixels 112 outside of this region. The increased dark current in imaging region (e.g., region 282) yields dark current non-uniformity across pixel array 222 and results in image artifacts.

Logic chip 220 and sensor chip 280 are in respective planes that are parallel to the x-y plane illustrated in FIG. 2. Herein, the x-y plane is formed by orthogonal axes A1 and A2, and planes parallel to the x-y plane are referred to as transverse planes. Each of axes A1 and A2 qualify as "image-plane directions," as they are parallel to an image plane of camera 180. Unless otherwise specified, heights of objects herein refer to the object's extent along axis A3. Herein, a reference to a direction x, y, or z refers to a direction along axes A1, A2, and A3 respectively. Also herein, a horizontal plane is parallel to the x-y plane, length and width refer to an object's extent along the x or y direction respectively, and a vertical direction is along the z direction. Also herein, the phrase "along an axis" A1, A2, and A3 means either in direction ±x, ±y, and ±z, respectively.

Figure 3:
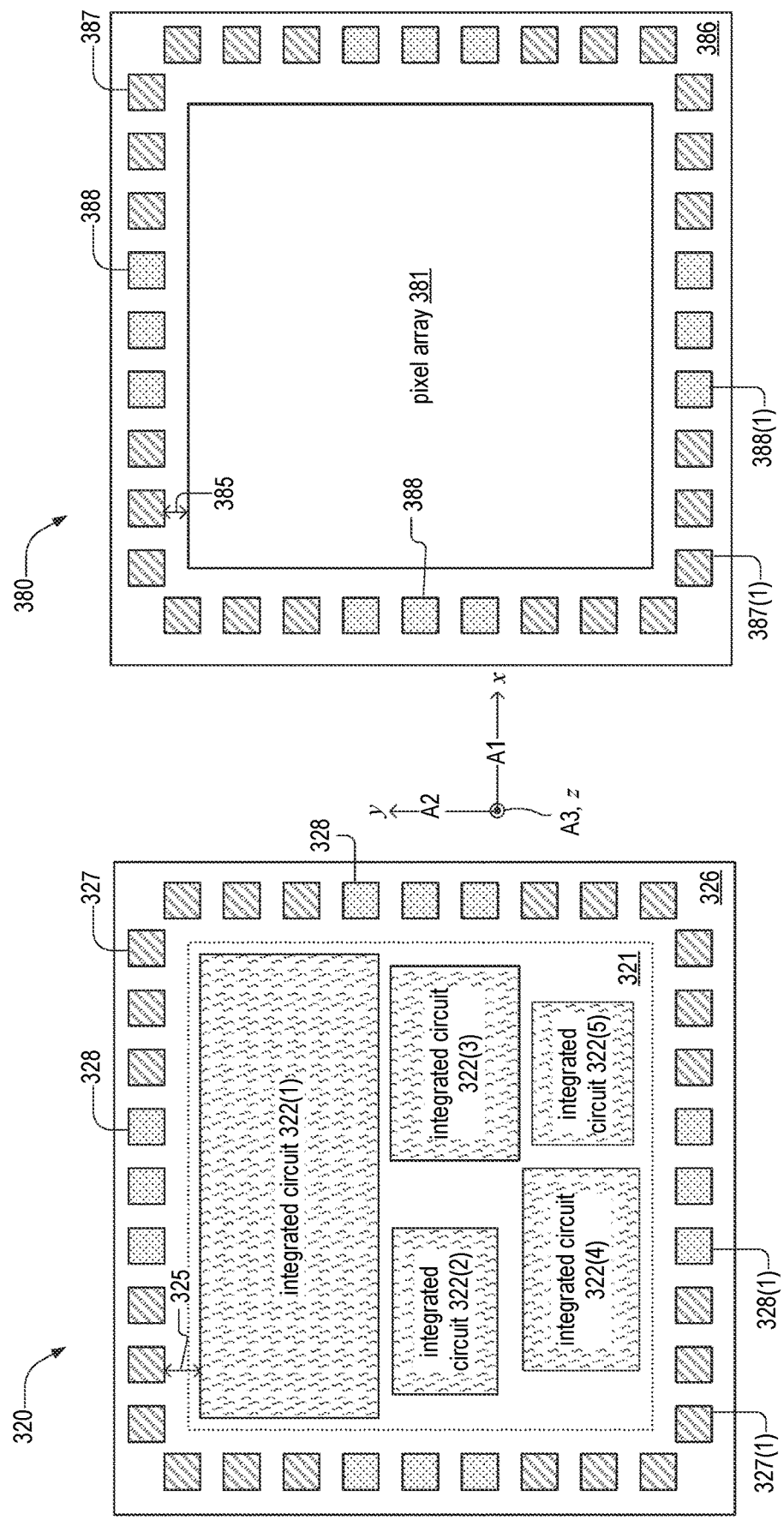
FIG. 3 is a schematic plan view of a signal-processing circuitry layer and a pixel-array substrate, which are respective examples of logic chip and sensor chip of the stacked-chip image sensor of FIG. 2.

FIG. 3 is a schematic plan view of a signal-processing circuitry layer 320 and a pixel-array substrate 380, which are examples of logic chip 220 and sensor chip 280, respectively. Signal-processing circuitry layer 320 includes a central region 321 and a periphery region 326 that surrounds central region 321. Central region 321 includes a plurality of integrated circuits 322, each of which is an example of high-temperature region 222. While FIG. 3 depicts five integrated circuits 322(1-5), signal-processing circuitry layer 320 may include more than or fewer than five integrated circuits 322. In embodiments, signal-processing circuitry layer 320 is formed of, or includes, a semiconductor substrate (second substrate) with one or metallization layers, where each of integrated circuits 322(1-5) includes one or more transistor and memory devices formed on the semiconductor substrate. Example functions of an integrated circuit 322 include but are not limited to phase detection autofocus, defect pixel correction, demosaicing, and remosaicing. In embodiments, at least one of (i) one integrated circuits 322 is memory chip, and (ii) an integrated circuit 322 includes an analog-to-digital converter.

FIG. 3 denotes a minimum distance 325 between a pad 327/328 and an integrated circuit 322, and a minimum distance 385 between a pad 387/388 and pixel array 381. In embodiments, minimum distance 325 is between 0.08 micrometers and 0.12 micrometers. In embodiments, distance 385 is between 0.10 micrometers and 0.16 micrometers.

Periphery region 326 includes a plurality of signal-conducting pads 327 (diagonal hatching), and a plurality heat-conducting pads 328 (gray fill). In embodiments, signal-conducting pads 327 and heat-conducting pads 328 are structurally identical and formed of the same material, and are distinguished only in terms of their function. Furthermore, any of signal-conducting pads 327 may be configured to function as a pad 328, and vice versa. In embodiments, one or more of heat-conducting pads 328 is also a ground pad (e.g., a pad that is connected to a ground connection). In some embodiments, heat-conducting pads 328 are arranged proximate to at least one integrated circuit 322 in high-temperature region 222.

Pixel-array substrate 380 includes a pixel array 381 surrounded by a periphery region 386. Pixel array 381 is an example of pixel array 112A for imaging, FIG. 1. Periphery region 386 includes a plurality of signal-conducting pads 387 (diagonal hatching), and a plurality of pads 388 (dotted fill). Each pad 388 may be one of a ground pad or a non-operational ("dummy") pad. In embodiments, pads 387 and 388 are structurally identical and formed of the same material, and are distinguished only in terms of their function. In embodiments, each of pads 327, 328, 387, and 388 are at least one of (a) identical, and (b) formed of a conductive material, such as a metal. In embodiments, and in the x-y plane, each signal-conducting pad 327 is aligned with a respective signal conducting pad 387, and each heat-conducting pad 328 is vertically aligned with a respective pad 388. For example, signal-conducting pad 327(1) is aligned with signal-conducting pad 387(1), and heat-conducting pad 328(1) is aligned with pad 388(1). In embodiments, each signal-conducting pads 387 is further electrically coupled to a respective signal-conducting pads 327 through a thermal via or a through silicon or substrate via. In embodiments, one or more of pads 387 and/or pads 388 is a ground pad. Herein, a ground pad herein may refer to a pad that is connected to a ground terminal or to a ground connection source.

FIG. 4 is an isometric view of an image sensor 400 that includes signal-processing circuitry layer 320, pixel-array substrate 380, a heat-transport layer 440, and at least one thermal via 450. Image sensor 400 may also include a heat-sink layer 410. Signal-processing circuitry layer 320 is disposed on heat-sink layer 410. Pixel-array substrate 380 is disposed on signal-processing circuitry layer 320. Heat-transport layer 440 is located between signal-processing circuitry layer 320 and pixel-array substrate 380. FIG. 4 includes arrows 402, which denote paths of heat flow away from pixel-array substrate 380 and from heat-transport layer 440 to heat sink layer 410 by way of thermal vias 450.

In embodiments, heat-transport layer 440 is a metallization layer. In some embodiments, heat-transport layer 440 is a metallization layer external to pixel array substrate 380 and signal-processing circuitry layer 320. In some embodiments, heat-transport layer 440 is a metallization layer external to a sensor chip and logic chip. In some embodiments, heat-transport layer 440 is a metallization layer that is part of metallization layer in a sensor chip or logic chip.

Each thermal via 450 thermally couples heat-transport layer 440 to heat-sink layer 410. In embodiments, each thermal via 450 is in direct contact with at least one of heat-transport layer 440 and heat-sink layer 410. In embodiments, thermal via 450 is a conductive element, e.g., a through-silicon via, that extends through signal-processing circuitry layer 320 to heat-sink layer 410. Thermal via 450 may be formed of a metal, such as copper. In other embodiments, heat-sink layer 410 may be a printed circuit board having image sensor 400 mounted thereon.

In embodiments, heat-transport layer 440 includes at least one protrusion 446 that extends in a horizontal plane parallel to a top surface 419 of heat-sink layer 410. FIG. 4 illustrates multiple protrusions 446 on at least one side of heat-transport layer 440.

Figure 5:
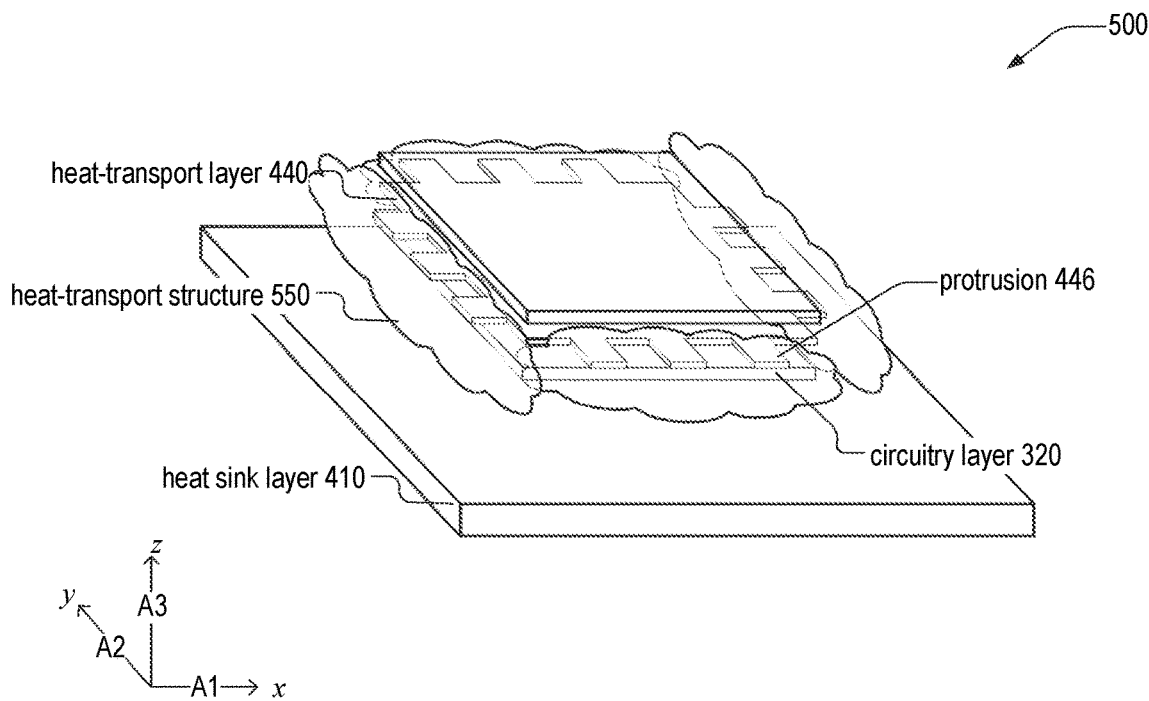
FIG. 5 is an isometric view of an image sensor, which is an example of the image sensor of FIG. 1.

FIG. 5 is an isometric view of an image sensor 500, which is equivalent to image sensor 400 that includes heat-transport layer 440 and at least one heat-transport structure 550. Heat-transport structure 550 may be formed of a thermal adhesive. In embodiments, heat-transport layer 440 is one of a metallization layer and a layer of thermal adhesive. In embodiments and along at least one of axis A1 and A2, the spatial extent of heat-transport layer 440 is greater than the spatial extent of each of pixel-array substrate 380 and signal-processing circuitry layer 320 such that, to route heat away from the pixel-array substrate 380, part of heat-transport layer 440 is disposed (i) outside of pixel-array substrate 380 and signal-processing circuitry layer 320, and (ii) between heat-transport layer 440 and heat-sink layer 410. In one embodiment, each of the protrusions 446 is configured to extend along direction A1 or A2 having a distal end external to pixel-array substrate 380 and signal-processing circuitry layer 320, and the layer of thermal adhesive may span (i) between adjacent protrusions 446 and (ii) between protrusions 446 and heat-sink layer 410 as shown in FIG. 5.

FIG. 6 is a schematic plan view of a heat-transport layer 640, which is an example of heat-transport layer 440 that has a plurality of distinct heat-transport layer regions 642. When image sensor 400 includes signal-processing circuitry layer 320 and heat-transport layer 640, each heat-transport layer region 642($k$) is aligned with a respective integrated circuit 322($k$) of signal-processing circuitry layer 320, where index integer $k \leq 5$ in the example of FIGS. 3 and 6.

In embodiments, heat-transport layer 640 includes a joining segment 647 between at least one pair of heat-transport layer regions 642, such that heat-transport layer 640 includes fewer distinct pieces than heat-transport layer regions. In embodiments, joining segment 647 is at least one of (i) made of same material as heat-transport layer 640 and (ii) formed at the same time as heat-transport layer 640. In embodiments, heat-transport layer 640 includes a plurality of protrusions 646, each of which is an example of protrusion 446.

In embodiments, when the number of integrated circuits 322 is N, heat-transport layer 640 lacks a region 642($k$) for at least one value of $k \leq N$. For example, in the example of FIG. 6, N=5, when integrated circuit 322(1) consumes less power (e.g., has a lower operating power or wattage) than integrated circuits 322(2-5), heat-transport layer may lack a region for k=1, such that no part of heat-transport layer 640 is directly above integrated circuit 322(1).

In embodiments, whether heat-transport layer 640 includes a region 642($k$) depends on the operating power of integrated circuit 322($k$) relative to one or more threshold power values. In embodiments, heat-transport layer 640 (a) lacks region 642($k$) when the operating power of integrated circuit 322($k$) is less than a first power threshold, and (b) includes region 642($k$) when the operating power of integrate circuit 322($k$) exceeds a second power threshold, which may equal the first power threshold. The first power threshold may be between 50 mW and 150 mW, e.g., 100 mW. The second power threshold may be between 400 mW and 600 mW, e.g., 500 mW.

FIG. 7 is a schematic plan view of a heat-transport layer 740, which is an example of heat-transport layer 440. Heat-transport layer 740 has an interior surface 742 that defines an aperture 744 through heat-transport layer 740. In this example, aperture 744 is aligned with integrated circuit 322(2), e.g., when integrated circuit 322(2) consumes less power (has a lower operating power) than integrated circuits 322(1, 3-5). In embodiments, interior surface 742 extends to an edge 741 of heat-transport layer 740, such that aperture 744 becomes a recess. In such embodiments, heat transport layer 740 covers integrated circuits 322(1, 3-5) that consumes relatively high power i.e., generate higher temperature or radiate higher heat energy during image sensor operation. Heat transport layer 740 shields the pixel array region on the pixel-array substrate 380 from integrated circuits 322(1, 3-5) formed in signal-processing circuitry layer 320 located below pixel-array substrate 380.

FIG. 8 is a cross-sectional view of an image sensor 800, which is an example of image sensor 400, FIG. 4. The cross-sectional view of FIG. 8 is representative of image sensor 800 in either or both of the x-z plane and the y-z plane. Image sensor 800 includes signal processing circuitry layer 320, a heat-transport layer 840, pixel-array substrate 380, and at least one thermal via 850.

In some embodiments, image sensor 800 includes a heat-sink layer 810. In other embodiments heat-sink layer 810 is external to image sensor 800. For example, image sensor 800 may be a stacked chip structure mounted on a printed circuit board having heat-sink layer 810 formed thereon. In some embodiments, image sensor 800 and heat-sink layer 810 are part of a camera module. In embodiments, image sensor 800 includes a logic chip 820 and a sensor chip 880. Heat-sink layer 810, heat transport layer 840 and thermal via 850 are respective examples of heat-sink layer 410, heat-transport layer 440 and thermal via 450. Heat-transport layer 840 has a thickness 844, which in embodiments is between fifty nanometers and one hundred nanometers. Heat-sink layer 810 has a top surface 819, which is an example of top surface 419.

Heat-sink layer 810 includes at least one conductive pad 812 aligned beneath periphery region 326. FIG. 8 illustrates that each thermal via 850 abuts a respective region 846. In embodiments, each region 846 is a protrusion, such as protrusion 446, that extends from heat transport layer 840, for example in a horizontal plane (e.g., that x-y plane) that is parallel to bottom surface 323 of signal-processing circuitry layer 320. Each thermal via 850 extends from a region 846 of heat-transport layer 840. In embodiments, each thermal via 850 extends along a direction in parallel to a plane that (i) is perpendicular to the bottom surface 323 of signal-processing circuitry layer 320, (ii) intersects periphery region 386 and periphery region 326. In embodiments, as shown beneath the left side of heat transport layer 840, at least one thermal via 850 abuts a bond pad 328 of signal-processing circuitry layer 320, and bond pad 328 is thermally coupled to a conductive pad 812, e.g., by a via 851.

In embodiments, at least one conductive pad 812 is an external terminal such as a solder bump, may be separate from heat-sink layer 810. In embodiments, for example, when image sensor 800 does not include heat-sink layer 810, at least one conductive pad 812 may be part of signal-processing circuitry layer 320. For example, one or more conductive pads 812 may be exposed on, or protrude from, a bottom surface 323 of signal-processing circuitry layer 320.

In embodiments, as shown beneath the right side of heat transport layer 840, at least one thermal via 850 extends from a region 846 of heat-transport layer 840, through periphery region 326, and abuts a respective conductive pad 812. As such, each thermal via 850 thermally couples heat transport layer 840 to a respective conductive pad 812. This thermal coupling routes heat generated by logic chip 820 away from sensor chip 880 and through logic chip 820 to heat sink layer 810, which is external to sensor chip 880 and logic chip 820. Routing heat way from sensor chip 880 reduces the impact of heat from the logic chip 820 on sensor chip 880 during operation of image sensor 800 and reduces dark-current non-uniformity of images captured by pixel array 381. In embodiments, sensor chip 880 is a backside illuminated image sensor, in which pixels of pixel array substrate 380 sense or receive light that is incident on a back surface 389 of pixel array substrate 380. Back surface 389 faces away from heat transport layer 840.

In embodiments, heat-sink layer 810 also includes at least one conductive pad 814 aligned beneath periphery region 326. In such embodiments, each conductive pad 812 is held at a first voltage, and each conductive pad 814 is held at a second voltage that differs from the first voltage. For example, when the first voltage is one of a supply voltage (either negative or positive) and ground, the second voltage is the other of the supply voltage and ground.

In embodiments, pixel-array substrate includes a pad 887 in periphery region 386. In embodiments, pad 887 is an example of either a signal-conducting pad 387 or a pad 388.

In embodiments, logic chip 820 is disposed on heat-sink layer 810 and includes a bottom interconnect-layer stack 829 and signal processing circuitry layer 320. Signal processing circuitry layer 320 is between bottom interconnect-layer stack 829 and heat-sink layer 810. Sensor chip 880 is disposed on logic chip 820 and includes a top interconnect-layer stack 889 and pixel-array substrate 380. Top interconnect-layer stack 889 is between bottom interconnect-layer stack 829 and pixel-array substrate 380.

Bottom interconnect-layer stack 829 includes a plurality of metal layers 822, each of which is embedded in a plurality of bottom inter-metal dielectric layers of stack 829. In embodiments, each bottom inter-metal dielectric layer spans between adjacent metal layers 822. Top interconnect-layer stack 889 includes a plurality of metal layers 882 embedded in a plurality of top inter-metal dielectric layers of stack 889. In embodiments, each top inter-metal dielectric layer spans between adjacent metal layers 822. In embodiments, the plurality of top inter-metal dielectric layers and bottom inter-metal dielectric layers include dielectric or insulation material such as silicon oxide, silicon nitride, porous oxide material, low-x dielectric material or other suitable material.

In embodiments, heat-transport layer 840 is located between bottom interconnect-layer stack 829 and top interconnect-layer stack 889. In embodiments, the heat-transport layer is one of metal layers 822 or one of metal layers 882, as shown in subsequent figures. While illustrations of image sensor 800 herein include four metal layers 822(1-4) and four metal layers 882(1-4), embodiments of stacked image sensors may include fewer than or more than four metal layers 822 and/or fewer than or more than four metal layers 882.

In embodiments, image sensor 800 includes a conductive element 884 that electrically connects sensor chip 880 to logic chip 820. Conductive element 884 may be a through-silicon via or a hybrid-bond redistribution layer, and connect sensor chip 880 to logic chip 820 for signal transmission. Examples of the transmitted signal include an image signal from sensor chip 880 to logic chip 820 and a driving signal from logic chip 820 to sensor chip 880.

In embodiments, either heat-sink layer 810 is a printed circuit board external to image sensor 800, or image sensor 800 includes a substrate 802 upon which heat-sink layer 810 is disposed. Substrate 802 may be a printed circuit board. When image sensor 800 includes a printed circuit board, either as heat-sink layer 810 or substrate 802 for example, heat-transport layer 840 may be thermally coupled to one of a ground terminal and a power-supply terminal of the printed circuit board.

FIG. 9 is a cross-sectional view of an image sensor 900, which is an example of image sensor 800 when the heat-transport layer is one of metal layers 822. Image sensor 900 includes sensor chip 880 stacked with a logic chip 920. Logic chip 920 is an example of logic chip 820 that includes a heat-transport layer 940, which is one of metal layers 822. Heat-transport layer 940 is an example of heat-transport layer 440 and is a most distal of metal layers 822 relative to signal processing circuitry 320. For example, when the most distal of metal layers 822 from signal processing circuitry 320 is metal layer 822(N), where N is an integer greater than one, heat-transport layer 940 is an example of metal layer 822(N).

Image sensor 900 includes at least one thermal via 950, which is an example of thermal via 450. Each thermal via 950 extends from a region 946 of heat-transport layer 940 through periphery region 326 of signal processing circuitry layer 320 to a conductive pad 812, thereby thermally coupling heat-transport layer 940 to conductive pad 812 and routing heat away from pixel array substrate 380 of sensor chip 880. Region 946 is an example of region 846 of heat-transport layer 840. Without departing from the scope of the embodiments hereof, heat-transport layer 940 may be a different one of metal layers 822, e.g., one of metal layers 822(3), 822(2), and 822(1).

FIG. 10 is a cross-sectional view of an image sensor 1000, which is an example of image sensor 800 when the heat-transport layer thereof is one of metal layers 882 e.g., or the most distal metal layer from pixel-array substrate 380. Specifically, image sensor 1000 includes a heat-transport layer 1040, which is an example of both layer 882(1) and heat-transport layer 440.

Image sensor 1000 includes at least one thermal via 1050, which is an example of thermal via 450. Each thermal via 1050 extends from a region 1046 of heat-transport layer 1040 through periphery region 326 of circuitry layer 320 and thermally couples to heat sink layer 810 to direct heat away from pixel array substrate 380 of sensor chip 880. Region 1046 is an example of region 846 of heat-transport layer 840. Without departing from the scope of the embodiments hereof, heat-transport layer 1040 may be a different one of metal layers 882, e.g., one of metal layers 882(2), 882(3), and 882(4).

FIG. 11 is a cross-sectional view of an image sensor 1100, which is an example of image sensor 900 that includes, in addition to heat-transport layer 940, a heat-transport layer 1130 and at least one conductive pad 814. Heat-transport layer 1130 is an example of heat-transport layer 440 and is one of metal layers 822. Image sensor 1100 includes at least one thermal via 1150, which is an example of thermal via 450. Each thermal via 1150 extends from a region 1136 of heat-transport layer 1130 through periphery region 326 to a conductive pad 814, and hence thermally couples heat-transport layer 1130 to conductive pad 814. Region 1136 is an example of region 846 of heat-transport layer 840. In embodiments, image sensor 1100 includes a plurality of conductive vias 1138 between, and electrically connecting, heat-transport layers 940 and 1130.

Heat-transport layer 1130 is between the heat-transport layer 940 and signal processing layer 320. In embodiments, heat-transport layer 1130 is vertically separated from the heat-transport layer 940 by at least one inter-metal dielectric layer of stack 829. In embodiments, heat-transport layer 1130 is adjacent to heat-transport layer 940, such that no metal layers 822 are between heat-transport layers 940 and 1130. FIG. 12 is a schematic plan view of heat transport layers FIG. 12 is a schematic plan view of heat-transport layers 1240 and 1230, which are respective examples of heat-transport layers 940 and 1130 of image sensor 1100, FIG. 11. Heat-transport layer 1240 includes a plurality of ground lines 1241 and a plurality of power lines 1242. Heat-transport layer 1230 includes a plurality of ground lines 1231 and a plurality of power lines 1232. In the plan view of FIG. 12, heat-transport layer 1230 is beneath heat-transport layer 1240. In embodiments, the plurality of ground lines 1241 is interleaved with the plurality of power lines 1242 in heat-transport layer 1240, such that ground lines 1241 and power lines 1242 form a plurality of first twisted pair traces. Similarly, the plurality of ground lines 1231 is interleaved with the plurality of power lines 1232 in heat-transport layer 1230, such that ground lines 1231 and power lines 1232 form a plurality of second twisted pair traces.

When operating in an image sensor, each power line 1232 and 1242 is held at a power voltage $V_{DD}$ and each ground line 1231 and 1241 is held at a reference voltage $V_{SS}$. In embodiments, at least one of (i) lines 1241 and 1242 are held at power voltage $V_{DD}$ and a ground reference voltage $V_{SS}$, respectively, such that lines 1241 and 1242 are a power line and a ground line respectively and (ii) lines 1231 and 1232 are held at power voltage $V_{DD}$ and ground reference voltage $V_{SS}$, respectively such that line 1231 and 1232 are a power line and a ground line respectively. Each of cases (i), (ii), and their combination reduce electromagnetic radiation emitted from signal processing layer 320. Power voltage $V_{DD}$ may be a power supply voltage or positive supply voltage and ground reference voltage $V_{SS}$ may be low internal reference voltage, zero volts, or negative voltage. The positive supply voltage may be between 0.9 V and 4 V. The negative voltage may be between −1 V and −0.1 V. However, it is appreciated that the power voltage may be configured based on the required operating voltage of the respective coupled circuitry in signal processing layer 320.

Heat-transport layer 1230 may include a plurality of column-terminating conductive pads 1236, each of which terminates a respective line 1231 or line 1232. Heat-transport layer 1240 may include a plurality of row-terminating conductive pads 1246, each of which terminates a respective line 1241 or line 1242. Heat-transport layer 1230 includes a plurality of L-shaped segments 1233 and 1234. Heat-transport layer 1240 includes a plurality of L-shaped segments 1243. Conductive pads 1236 and 1246 are respective examples of region 1136 and 946, FIG. 11. For clarity of illustration, not all conductive pads 1246 are labeled with a reference numeral.

FIG. 12 illustrates twisted pairs 1249, twisted pairs 1247, and twisted pairs 1248. Each twisted pair 1249 includes a section of a power line 1242, one L-shaped segment 1233, and two conductive vias 1138 that electrically connect respective ends of L-shaped segment 1233 to respective ends of an adjacent ground line 1241. For clarity of illustration, FIG. 12 denotes just two pairs of conductive vias with a reference numeral.

Each twisted pair 1247 includes a section of a power line 1232, one L-shaped segment 1243, and two conductive vias 1138 that electrically connect respective ends of L-shaped segment 1243 to respective ends of an adjacent ground line 1231. Each twisted pair 1248 includes a section of a ground line 1241, one L-shaped segment 1234, and two conductive vias 1138 that electrically connect respective ends of L-shaped segment 1234 to respective ends of an adjacent power line 1242. In embodiments, a signal transmitted through a L-shaped segment 1233 connecting sections of ground line 1241 in heat-transport layer 1230 is a ground signal while a signal transmitted to through the sections of power line 1242 located above the L-shaped segment 1233 is power signal.

By including parts of a ground line and a power line, each of twisted pairs 1249-1248 contributes to equalizing electromagnetic interference on the power and ground lines, thereby shielding sensor chip 880 from electromagnetic interference, for example generated by one or more integrated circuits in the signal processing circuitry layer of logic chip 820.

FIG. 13 is a schematic plan view of alterative layout design of heat-transport layers 1240 and 1330. Heat-transport layer 1330 is an example heat-transport layer 1130 of image sensor 1100, FIG. 11. Heat-transport layer 1330 includes a plurality of ground lines 1331 and a plurality of power lines 1332. In the plan view of FIG. 13, heat-transport layer 1330 is beneath heat-transport layer 1240.

When operating in an image sensor, each power line 1331 is, in embodiments, held at power voltage $V_{DD}$ and each ground line 1332 is held at ground reference voltage $V_{SS}$. In embodiments, the voltage applied to lines 1331 and 1332 are reversed, such that each line 1331 and 1332 is power line and ground line respectively.

Heat-transport layer 1330 may include a plurality of column-terminating conductive pads 1236 terminate ground lines 1331 and power lines 1332. Ground lines 1331 and power lines 1332 may supply, respectively, power voltage and ground reference voltage to integrated circuits of signal processing circuitry layer 320. Heat-transport layer 1330 includes a plurality of L-shaped segments 1233 and 1234. FIG. 13 includes twisted pairs 1249 and twisted pairs 1248, each of which are described above with the description of FIG. 12.

FIG. 14 is an isometric view of a twisted pair 1346, which is example of each of twisted pairs 1249-1248. Twisted pair 1346 includes a first wire 1341 and a second wire 1342 in a first layer, which may be a most-distal metal layer such as heat-transport layer 1240. Twisted pair 1346 also includes a L-shaped segment 1333 (denoted by a dashed line) in an adjacent metal layer, such as heat-transport layer 1230 and 1330. FIG. 14 denotes distances $\Delta x_1$, $\Delta y_1$, and $\Delta z_1$ each of which, in embodiments, is greater than or equal to 0.3 micrometers.

First wire 1341 includes (i) a proximal segment 1341(1) oriented along axis A1, (ii) a distal segment 1341(3) offset from proximal segment 1341(1) along both axes A1 and A2, and (iii) a connecting segment 1341(2) that connects a distal end of proximal segment 1341(1) to a proximal end of distal segment 1341(3). Second wire 1342 includes a proximal segment 1342(1) and a distal segment 1342(2). Proximal segment 1342(1) is adjacent to proximal segment 1341(1) along direction A2 and is colinear with distal segment 1341(3). Distal segment 1342(2) is adjacent to distal segment 1341(3) along direction A2 and is colinear with first proximal segment 1341(1).

L-shaped segment 1333 includes a linear segment 1333(1) and a linear segment 1333(2) perpendicular thereto. Linear segment 1333(1) is partially beneath distal segment 1341(3) and has a proximal end beneath a distal end of proximal segment 1342(1) and electrically connected thereto by conductive via 1138(1). Linear segment 1333(2) has an end located beneath a proximal end of distal segment 1342(2) and electrically connected thereto by conductive via 1138(2).

In embodiments, first wire 1341 and second wire 1342 are electrically isolated by an inter-metal dielectric material (e.g., silicon oxide or low-κ dielectric material). In one example, first wire 1341 and second wire 1342 are embedded in at least one layer of inter-metal dielectric material. For example, linear segment 1333(1) of second wire 1342 is electrically isolated from the distal segment 1341(3) of first wire 1341 by inter-metal dielectric material disposed therebetween, and linear segment 1333(2) of second wire 1342 is electrically isolated from the distal segment 1341(3) of first wire 1341 by inter-metal dielectric material disposed therebetween. Conductive vias 1138(1) and 1138(2) extend through inter-metal dielectric material to electrically connect distal end of proximal segment 1342(1) to linear segment 1333(1) and proximal end of segment 1342(2) to linear segment 1333(2).

Combinations of Features

Features described above as well as those claimed below may be combined in various ways without departing from the scope hereof. The following enumerated examples illustrate some possible, non-limiting combinations.

(A1) A stacked image sensor includes a signal-processing circuitry layer, a pixel-array substrate, a heat-transport layer, and a thermal via. The signal-processing circuitry layer includes a conductive pad exposed on a circuitry-layer bottom surface of the signal-processing circuitry layer. The pixel-array substrate includes a pixel array and is disposed on a circuitry-layer top surface of the signal-processing circuitry layer. The circuitry-layer top surface is between the circuitry-layer bottom surface and the pixel-array substrate. The heat-transport layer is located between the signal-processing circuitry layer and the pixel-array substrate. The thermal via physically connects the heat-transport layer and the conductive pad.

(A2) In embodiments of image sensor (A1), the pixel-array substrate includes an upper periphery region that surrounds the pixel array and the heat-transport layer includes a protrusion extending in a horizontal plane parallel to the circuitry-layer bottom surface. The thermal via abuts the protrusion in a vertical plane that (i) is perpendicular to the horizontal plane and (ii) intersects the upper periphery region.

(A3) In embodiments of image sensor (A2), the signal-processing circuitry layer includes a plurality of integrated circuits and a lower periphery region theresurrounding that intersects the vertical plane, and the thermal via extends from the heat-transport layer through the lower periphery region.

(A4) Embodiments of either one of image sensors (A2) and (A3), include, when the heat-transport layer includes a plurality of additional protrusions each extending in the horizontal plane, a plurality of additional thermal vias each abutting a respective one of the plurality of additional protrusions in the vertical plane.

(A5) In embodiments of image sensor (A4), the signal-processing circuitry layer includes a plurality of integrated circuits and a lower periphery region theresurrounding that intersects the vertical plane. In such embodiments, each of the plurality of additional thermal vias extends from the heat-transport layer through the lower periphery region.

(A6) In embodiments of any one of image sensors (A1)-(A5), the signal-processing circuitry layer includes a plurality of integrated circuits, the heat-transport layer including a plurality of distinct regions each aligned above a respective one of the plurality of integrated circuits.

(A7) In embodiments of image sensor (A6): each of the plurality of integrated circuits has a respective one of a plurality of operating powers; the signal-processing circuitry layer includes an additional integrated circuit having an operating power that is less than a minimum of the plurality of operating powers; and the heat-transport layer forms one of an aperture and a recess aligned between the additional integrated circuit and the pixel array.

(A8) In embodiments of any one of image sensors (A1)-(A7), the signal-processing circuitry layer includes a first integrated circuit having a first operating power and a second integrated circuit having a second operating power that exceeds the first operating power. At least part of the heat-transport layer is located between the second integrated circuit and the pixel array. The heat-transport layer forms one of an aperture and a recess aligned between the first integrated circuit and the pixel array.

(A9) In embodiments of any one of image sensors (A1)-(A8), a thickness of the heat-transport layer is between fifty nanometers and one hundred nanometers.

(A10) In embodiments of any one of image sensors (A1)-(A9), the signal-processing circuitry layer includes a plurality of integrated circuits and a lower periphery region theresurrounding; and the thermal via extends from the heat-transport layer through the lower periphery region.

(A11) In embodiments of any one of image sensors (A1)-(A10), the pixel-array substrate includes a ground pad that is (i) located in an upper periphery region that surrounds the pixel array and (ii) thermally coupled to the heat-transport layer through the thermal via.

(A12) Embodiments of any one of image sensors (A1)-(A11) further include a bottom interconnect-layer stack and a top interconnect-layer stack. The bottom interconnect-layer stack is on the signal-processing circuitry layer. The top interconnect-layer stack is located between the pixel-array substrate and the bottom interconnect-layer stack.

(A13) In embodiments of image sensor (A12), the heat-transport layer being located between the bottom interconnect-layer stack and the top interconnect-layer stack.

(A14) In embodiments of either one of image sensors (A12) and (A13), the bottom interconnect-layer stack includes a plurality of metal layers, the heat-transport layer being a most-distal metal layer of the plurality of metal layers relative to the circuitry-layer bottom surface.

(A15) Embodiments of image sensor (A14) further include an additional heat-transport layer located between the heat-transport layer and the circuitry-layer bottom surface and thermally coupled to the conductive pad. The additional heat-transport layer is an additional metal layer, of the plurality of metal layers, proximate to the heat-transport layer.

(A16) Embodiments of image sensor (A15) further include a plurality of conductive vias between and connecting the heat-transport layer and the additional heat-transport layer.

(A17) Embodiments of image sensor (A16) include, when the additional metal layer being adjacent to the most-distal metal layer and between the most-distal metal layer and the circuitry-layer bottom surface, a twisted pair of wires. The twisted pair of wires include, in the most-distal metal layer and with respect to a first side thereof: a first wire and a second wire. The first wire includes (i) a first proximal segment oriented in a first direction, (ii) a first distal segment offset from the first proximal segment in both the first direction and a second direction perpendicular to the first direction, and (iii) a connecting segment that connects a distal end of the first proximal segment to a proximal end of the first distal segment. The second wire includes (i) a second proximal segment adjacent to the first proximal segment in the second direction and collinear with the first distal segment, (ii) a second distal segment adjacent to the first distal segment in the second direction and collinear with the first proximal segment. The twisted pair also includes, in the additional metal layer, an L-shaped segment including (i) a first linear segment partially beneath the first distal segment and having a proximal end beneath a distal end of the second proximal segment and (ii) a distal end beneath a proximal end of the second distal segment. The twisted pair also includes: (v1) a first conductive via, of the plurality of conductive vias, that electrically connects the proximal end of the L-shaped segment to the distal end of the second proximal segment; and (v2) a second conductive via, of the plurality of conductive vias, that electrically connects the distal end of the L-shaped segment to the proximal end of the second distal segment.

(A18) In embodiments of any one of image sensors (A12)-(A17), the top interconnect-layer stack includes a plurality of metal layers, and the heat-transport layer is a most distal of the plurality of metal layers relative to the pixel-array substrate.

(A19) Embodiments of any one of image sensors (A12)-(A18), further include a logic chip, a sensor chip, and a conductive structure. The logic chip includes the bottom interconnect-layer stack and the signal-processing circuitry layer. The sensor chip is disposed on the logic chip and includes the pixel-array substrate, and between the pixel-array substrate and the bottom interconnect-layer stack, the top interconnect-layer stack. The conductive structure electrically connects the top interconnect-layer stack of the sensor chip to the bottom interconnect-layer stack of the logic chip. The structure is one of a through-silicon via and a hybrid-bond redistribution layer.

(A20) In embodiments of any one of image sensors (A1)-(A19), the heat-transport layer includes at least one of a metallization layer and a thermal adhesive.

(A21) Embodiments of any one of image sensors (A1)-(A20) further include a heat-sink layer. The signal-processing circuitry layer is disposed thereon.

(A22) In embodiments of image sensor (A21), the heat-sink layer is a printed circuit board, and the heat-transport layer is thermally coupled to a one of a ground terminal and a power-supply terminal of the printed circuit board.

(A23) Embodiments of either one of image sensors (A21)-(A22) further include a substrate, and the heat-sink layer is disposed on the substrate. The substrate may be a printed circuit board.

(B1) A stacked image sensor includes a heat-sink layer, a signal-processing circuitry layer disposed on the heat-sink layer, a pixel-array substrate, a heat-transport layer, and a thermal via. The pixel-array substrate includes a pixel array and being disposed on the signal-processing circuitry layer. The heat-transport layer is located between the signal-processing circuitry layer and the pixel-array substrate. The thermal via thermally couples the heat-transport layer to the heat-sink layer.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:
1. A stacked image sensor comprising:
    a signal-processing circuitry layer including a conductive pad exposed on a circuitry-layer bottom surface of the signal-processing circuitry layer;
    a pixel-array substrate including a pixel array and being disposed on a circuitry-layer top surface of the signal-processing circuitry layer, the circuitry-layer top surface being between the circuitry-layer bottom surface and the pixel-array substrate;
    a heat-transport layer located between the signal-processing circuitry layer and the pixel-array substrate, at least part of the heat-transport layer being directly between the pixel array and the signal-processing circuitry layer; and
    a thermal via that (i) extends from the heat-transport layer toward and through the signal-processing circuitry layer and (ii) thermally couples the heat-transport layer to the conductive pad.
2. The image sensor of claim 1,
    the pixel-array substrate including an upper periphery region that surrounds the pixel array,
    the heat-transport layer including a protrusion extending in a horizontal plane parallel to the circuitry-layer bottom surface, the thermal via abutting the protrusion in a vertical plane that (i) is perpendicular to the horizontal plane and (ii) intersects the upper periphery region.
3. The image sensor of claim 2,
    the signal-processing circuitry layer including a plurality of integrated circuits and a lower periphery region there surrounding that intersects the vertical plane,
    the thermal via extending from the heat-transport layer through the lower periphery region.
4. The image sensor of claim 2, the heat-transport layer including a plurality of
    additional protrusions each extending in the horizontal plane, and further comprising:
    a plurality of additional thermal vias each abutting a respective one of the plurality of additional protrusions in the vertical plane.

5. The image sensor of claim 4,
the signal-processing circuitry layer including a plurality of integrated circuits and a lower periphery region there surrounding that intersects the vertical plane, and
each of the plurality of additional thermal vias extending from the heat-transport layer through the lower periphery region.

6. The image sensor of claim 1, the signal-processing circuitry layer including a plurality of integrated circuits, the heat-transport layer including a plurality of distinct regions each aligned above a respective one of the plurality of integrated circuits.

7. The image sensor of claim 6, each of the plurality of integrated circuits having a respective one of a plurality of operating powers, the signal-processing circuitry layer including an additional integrated circuit having an operating power that is less than a minimum of the plurality of operating powers, the heat-transport layer forming one of an aperture and a recess aligned between the additional integrated circuit and the pixel array.

8. The image sensor of claim 1,
the signal-processing circuitry layer including a plurality of integrated circuits and a lower periphery region there surrounding; and
the thermal via extending from the heat-transport layer through the lower periphery region.

9. The image sensor of claim 1, further comprising:
a bottom interconnect-layer stack on the signal-processing circuitry layer; and
a top interconnect-layer stack located between the pixel-array substrate and the bottom interconnect-layer stack.

10. The image sensor of claim 9, the heat-transport layer being located between the bottom interconnect-layer stack and the top interconnect-layer stack.

11. The image sensor of claim 9, the bottom interconnect-layer stack including a plurality of metal layers, the heat-transport layer being a most-distal metal layer of the plurality of metal layers relative to the circuitry-layer bottom surface.

12. The image sensor of claim 11, further comprising:
an additional heat-transport layer located between the heat-transport layer and the circuitry-layer bottom surface and thermally coupled to the conductive pad, the additional heat-transport layer being an additional metal layer, of the plurality of metal layers, proximate to the heat-transport layer.

13. The image sensor of claim 12, further comprising a plurality of conductive vias between and connecting the heat-transport layer and the additional heat-transport layer.

14. The image sensor of claim 13, the additional metal layer being adjacent to the most-distal metal layer and between the most-distal metal layer and the circuitry-layer bottom surface, and further comprising a twisted pair of wires that includes:
(a) in the most-distal metal layer and with respect to a first side thereof:
a first wire including (i) a first proximal segment oriented in a first direction, (ii) a first distal segment offset from the first proximal segment in both the first direction and a second direction perpendicular to the first direction, and (iii) a connecting segment that connects a distal end of the first proximal segment to a proximal end of the first distal segment;
a second wire including (i) a second proximal segment adjacent to the first proximal segment in the second direction and collinear with the first distal segment, (ii) a second distal segment adjacent to the first distal segment in the second direction and collinear with the first proximal segment;
and
(b) in the additional metal layer, an L-shaped segment including (i) a first linear segment partially beneath the first distal segment and having a proximal end beneath a distal end of the second proximal segment and (ii) a distal end beneath a proximal end of the second distal segment;
(c) a first conductive via, of the plurality of conductive vias, that electrically connects the proximal end of the L-shaped segment to the distal end of the second proximal segment; and
(d) a second conductive via, of the plurality of conductive vias, that electrically connects the distal end of the L-shaped segment to the proximal end of the second distal segment.

15. The image sensor of claim 9, the top interconnect-layer stack including a plurality of metal layers, the heat-transport layer being a most distal of the plurality of metal layers relative to the pixel-array substrate.

16. The image sensor of claim 9, further comprising:
a logic chip that includes the bottom interconnect-layer stack and the signal-processing circuitry layer;
a sensor chip disposed on the logic chip and including the pixel-array substrate, and between the pixel-array substrate and the bottom interconnect-layer stack, the top interconnect-layer stack; and
a conductive structure that electrically connects the top interconnect-layer stack of the sensor chip to the bottom interconnect-layer stack of the logic chip, the conductive structure being one of a through-silicon via and a hybrid-bond redistribution layer.

17. The image sensor of claim 1, the heat-transport layer including at least one of a metallization layer and a thermal adhesive.

18. The image sensor of claim 1, further comprising a heat-sink layer, the signal-processing circuitry layer being disposed thereon.

19. The image sensor of claim 18, the heat-sink layer being a printed circuit board, the heat-transport layer being thermally coupled to a one of a ground terminal and a power-supply terminal of the printed circuit board.

20. The image sensor of claim 18, further comprising a substrate, the heat-sink layer being disposed thereon.

21. A stacked image sensor comprising: of claim 1,
a signal-processing circuitry layer including (i) a conductive pad exposed on a circuitry-layer bottom surface of the signal-processing circuitry layer and (ii) a first integrated circuit having a first operating power and a second integrated circuit having a second operating power that exceeds the first operating power,
a pixel-array substrate including a pixel array and being disposed on a circuitry-layer top surface of the signal-processing circuitry layer, the circuitry-layer top surface being between the circuitry-layer bottom surface and the pixel-array substrate;
a heat-transport layer located between the signal-processing circuitry layer and the pixel-array substrate and forming one of an aperture and a recess aligned between the first integrated circuit and the pixel array, at least part of the heat-transport layer being located between the second integrated circuit and the pixel array; and
a thermal via that thermally couples the heat-transport layer to the conductive pad.

22. A stacked image sensor comprising:
a heat-sink layer;
a signal-processing circuitry layer disposed on the heat-sink layer;
a pixel-array substrate including a pixel array and being disposed on the signal-processing circuitry layer;
a heat-transport layer located between the signal-processing circuitry layer and the pixel-array substrate, at least part of the heat-transport layer being directly between the pixel array and the signal-processing circuitry layer; and
a thermal via that (i) extends from the heat-transport layer toward and through the signal-processing circuitry layer and (ii) thermally couples the heat-transport layer to the heat-sink layer.

* * * * *